(12) United States Patent
Chang et al.

(10) Patent No.: US 12,512,451 B2
(45) Date of Patent: Dec. 30, 2025

(54) SEMICONDUCTOR PACKAGE AND MANUFACTURING METHOD OF THE SAME

(71) Applicant: Taiwan Semiconductor Manufacturing Company, Ltd., Hsinchu (TW)

(72) Inventors: Mao-Yen Chang, Kaohsiung (TW); Chun-Cheng Lin, New Taipei (TW); Chih-Wei Lin, Hsinchu County (TW); Yi-Da Tsai, Chiayi Country (TW); Hsaing-Pin Kuan, Hsinchu (TW); Chih-Chiang Tsao, Taoyuan (TW); Hsuan-Ting Kuo, Taichung (TW); Hsiu-Jen Lin, Hsinchu County (TW); Yu-Chia Lai, Hsinchu (TW); Kuo-Lung Pan, Miaoli County (TW); Hao-Yi Tsai, Hsinchu (TW); Ching-Hua Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 714 days.

(21) Appl. No.: 17/882,626

(22) Filed: Aug. 8, 2022

(65) Prior Publication Data
US 2024/0047446 A1 Feb. 8, 2024

(51) Int. Cl.
*H01L 25/065* (2023.01)
*H01L 23/00* (2006.01)
(Continued)

(52) U.S. Cl.
CPC .............. *H01L 25/18* (2013.01); *H01L 24/11* (2013.01); *H01L 24/13* (2013.01); *H01L 24/14* (2013.01);
(Continued)

(58) Field of Classification Search
CPC ......... H01L 24/11; H01L 24/13; H01L 24/14; H01L 24/20; H01L 24/81; H01L 24/95; H01L 25/0652
See application file for complete search history.

(56) References Cited

U.S. PATENT DOCUMENTS

| | | | |
|---|---|---|---|
| 2009/0200663 A1* | 8/2009 | Daubenspeck | ... H01L 23/49816 257/E21.511 |
| 2013/0175686 A1* | 7/2013 | Meyer | ...................... H01L 24/17 257/737 |
| 2020/0365571 A1* | 11/2020 | Chen | ................... H01L 23/3128 |

FOREIGN PATENT DOCUMENTS

| | | |
|---|---|---|
| TW | 201926588 | 7/2019 |
| TW | 202207366 | 2/2022 |

(Continued)

OTHER PUBLICATIONS

"Office Action of Taiwan Counterpart Application", issued on Oct. 13, 2023, pp. 1-9.

*Primary Examiner* — Phat X Cao
(74) *Attorney, Agent, or Firm* — JCIPRNET

(57) ABSTRACT

A semiconductor package and a manufacturing method thereof are described. The semiconductor package includes a package having dies encapsulated by an encapsulant, a redistribution circuit structure, first and second modules and affixing blocks. The redistribution circuit structure is disposed on the package. The first and second modules are disposed on and respectively electrically connected to the redistribution circuit structure by first and second connectors disposed there-between. The first and second modules are adjacent to each other and disposed side by side on the redistribution circuit structure. The affixing blocks are disposed on the redistribution circuit structure and between the first and second modules and the redistribution circuit structure. The affixing blocks include first footing portions (Continued)

located below the first module, second footing portions located below the second module, and exposed portions exposed from the first and second modules. The affixing blocks join the first and second modules to the redistribution circuit structure.

20 Claims, 13 Drawing Sheets

(51) Int. Cl.
 *H01L 25/00* (2006.01)
 *H01L 25/18* (2023.01)
 *H01R 12/57* (2011.01)
(52) U.S. Cl.
 CPC .............. *H01L 24/16* (2013.01); *H01L 24/19* (2013.01); *H01L 24/20* (2013.01); *H01L 24/81* (2013.01); *H01L 24/95* (2013.01); *H01L 25/0652* (2013.01); *H01L 25/50* (2013.01); *H01R 12/57* (2013.01); *H01L 2224/1131* (2013.01); *H01L 2224/13016* (2013.01); *H01L 2224/13144* (2013.01); *H01L 2224/13155* (2013.01); *H01L 2224/13164* (2013.01); *H01L 2224/1319* (2013.01); *H01L 2224/1329* (2013.01); *H01L 2224/13386* (2013.01); *H01L 2224/1403* (2013.01); *H01L 2224/14505* (2013.01); *H01L 2224/14517* (2013.01); *H01L 2224/16059* (2013.01); *H01L 2224/1607* (2013.01); *H01L 2224/16108* (2013.01); *H01L 2224/16238* (2013.01); *H01L 2224/19* (2013.01); *H01L 2224/2101* (2013.01); *H01L 2224/214* (2013.01); *H01L 2224/81193* (2013.01); *H01L 2224/81201* (2013.01); *H01L 2224/81815* (2013.01); *H01L 2224/81862* (2013.01); *H01L 2224/81906* (2013.01); *H01L 2224/8192* (2013.01); *H01L 2224/95001* (2013.01); *H01L 2924/05442* (2013.01); *H01L 2924/0635* (2013.01); *H01L 2924/0665* (2013.01); *H01L 2924/07025* (2013.01); *H01L 2924/1427* (2013.01); *H01L 2924/1431* (2013.01); *H01L 2924/1432* (2013.01); *H01L 2924/1433* (2013.01); *H01L 2924/14361* (2013.01)

(56) References Cited

FOREIGN PATENT DOCUMENTS

| TW | 1773451 | 8/2022 |
| TW | 202230646 | 8/2022 |

\* cited by examiner

SEMICONDUCTOR PACKAGE AND MANUFACTURING METHOD OF THE SAME

BACKGROUND

The semiconductor industry has experienced rapid growth due to continuous improvements in the integration of various electronic components and different types of dies or devices. For the most part, wafer-level packaging technology allows more components of various functions and different types to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
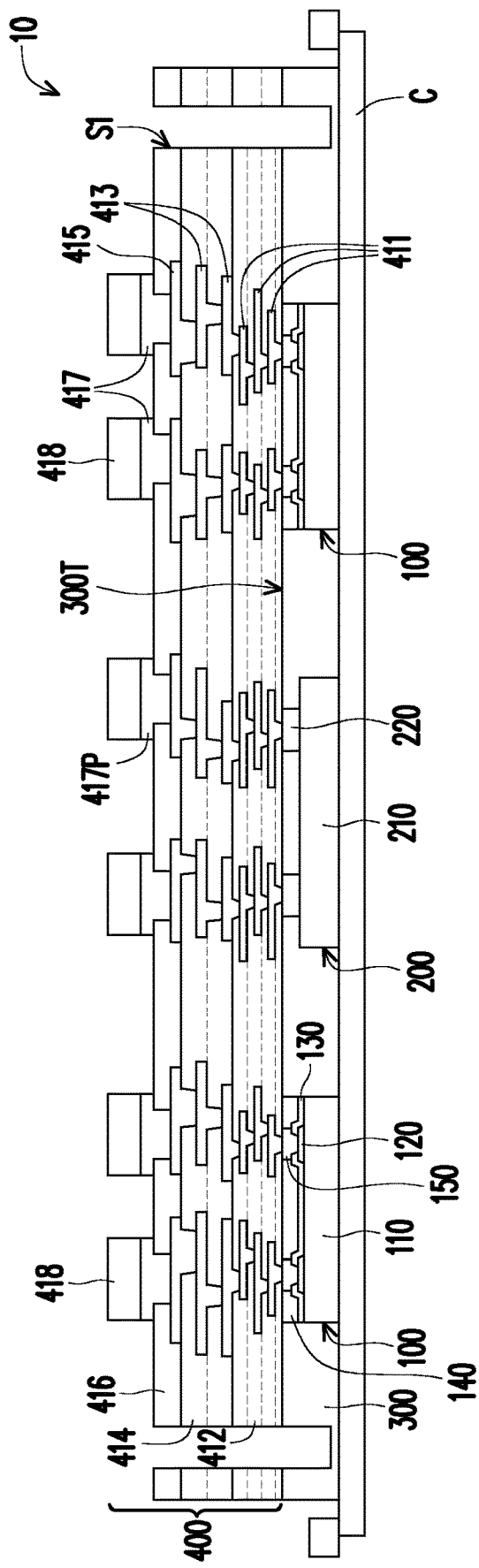
FIG. 1 to FIG. 5 are schematic cross-sectional views illustrating a process flow of manufacturing a semiconductor package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

FIG. 1 to FIG. 5 are schematic cross-sectional views illustrating a process flow of manufacturing a semiconductor package in accordance with some embodiments.

Referring to FIG. 1, a carrier C is provided and a package structure 10 is placed on the carrier C with pre-cut lanes S1 formed in the package structure 10. In some embodiments, the carrier C includes a carrier tape suitable for carrying a panel or a wafer or a reconstructed wafer. In other embodiments, the carrier C includes a glass substrate having debond layer such as a light-to-heat conversion (LTHC) release layer formed on the glass substrate.

Referring to FIG. 1, the package 10 includes a reconstructed wafer structure or an integrated fan-out (InFO) package. In some embodiments, the package 10 includes first semiconductor dies 100 and at least one second semiconductor die 200 laterally encapsulated by an encapsulant 300. In some embodiments, the first and second semiconductor dies 100 and 200 are arranged in an array and wrapped by the encapsulant 300.

In some embodiments, the first semiconductor die 100 includes a semiconductor substrate 110, conductive pads 120 formed on the semiconductor substrate 110, a passivation layer 130 covering the conductive pads 120, conductive pillars 150 formed on the conductive pads 120 and a protection layer 140 on the passivation layer 130 and covering the conductive pillars 150. In some embodiments, the semiconductor substrate 110 may be a silicon substrate including active components (e.g., transistors or the like), passive components (e.g., resistors, capacitors, inductors or the like), and an interconnection structure for interconnecting the active and/or passive components. In some embodiments, the conductive pads 120 include aluminum pads, copper pads or other suitable metal pads, and the conductive pillars 150 include copper pillars or other suitable metal pillars. In some embodiments, the passivation layer 130 may be or include a silicon oxide layer, a silicon nitride layer, a silicon oxy-nitride layer or a dielectric layer formed by other suitable dielectric materials, while the protection layer 140 may be or include a polyimide (PI) layer, a polybenzoxazole (PBO) layer, or a suitable polymeric material layer. In some embodiments, the second semiconductor die 200 includes a semiconductor substrate 210 and conductive connectors 220 formed on the semiconductor substrate 210. In some embodiments, the semiconductor substrate 210 may be a silicon substrate including active components (e.g., transistors or the like), passive components (e.g., resistors, capacitors, inductors or the like), and an interconnection structure for interconnecting the active and/or passive components. In some embodiments, the conductive connectors 220 include metal connectors such as aluminum or copper posts.

For the package 10 as shown in FIG. 1, each of the semiconductor dies 100 and 200 may independently be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, at least one of the semiconductor dies 100 and 200 include a memory die such as a high bandwidth memory die. In some embodiments, the semiconductor dies 100 and 200 may be the same type of dies or perform the same functions. In some embodiments, the semiconductor dies 100 and 200 may be different types of dies or perform different functions.

In some embodiments, the semiconductor die(s) 100 includes a logic die, and the semiconductor die 200 includes a memory die.

As shown in FIG. 1, in some embodiments, the encapsulant 300 is formed by a molding process and optionally a planarization process such as a chemical mechanical polishing (CMP) process. As shown in FIG. 1, the encapsulant 300 wraps around the sidewalls of the first and second semiconductor dies 100 and 200 and covers the protection layers 140 of the semiconductor dies 100 and the conductive connectors 220 of the semiconductor die 200. In some embodiments, the insulating material of the encapsulant 300 includes epoxy resins or other suitable resin materials.

Referring to FIG. 1, after the encapsulant 300 is formed, a redistribution circuit structure 400 electrically connected to the conductive pillars 150 of the semiconductor dies 100 and the conductive connectors 220 of the semiconductor die 200 is formed on the top surface 300T of the insulating encapsulant 300, and the redistribution circuit structure 400 is electrically connected with the conductive pillars 150 of the first semiconductor dies 100 and the conductive connectors 220 of the second semiconductor die 200. The redistribution circuit structure 400 is fabricated to electrically connect the underlying dies with other components or devices.

In some embodiments, the formation of the redistribution layer 400 includes sequentially forming one or more dielectric layers 412, 414, 416, and one or more conductive layers 411, 413, 415 in alternation. In certain embodiments, the conductive layers 411, 413, 415 are sandwiched between the dielectric layers 412, 414, 416. For example, the bottommost dielectric layer 412 is formed on the insulating encapsulant 300, and the conductive layers 411 are formed within the dielectric layer 412 and the bottommost layer of the conductive layers 411 is directly connected with the conductive pillars 150 of the first semiconductor dies 100 and the conductive connectors 220 of the second semiconductor die 200. In some embodiments, the conductive layers 411, 413 and 415 include metallic lines and vias stacked upon and connected with one another. Either of the dielectric layers 412, 414 and 416 may include more than one dielectric layers.

As shown in FIG. 1, the redistribution layer 400 includes a conductive layer 417 formed on the dielectric layer 416 and electrically connected to the conductive layer 415. In some embodiments, the conductive layer 417 includes conductive pads 417P disposed on exposed top surface(s) of the conductive layer 415. In certain embodiments, the conductive pads 417P include under-ball metallurgy (UBM) patterns used for bump or ball mount. In some embodiments, conductive blocks 418 are formed directly on the conductive pads 417P.

It is understood that the numbers and the configurations of the conductive layers 411, 413, 415, 417 and the dielectric layers 412, 414, 416 are not limited in this disclosure, and may be selected or adjusted based on the design layout and product requirements. In some embodiments, seed layers (not shown) may be formed prior to forming the conductive layers.

In certain embodiments, the material of the dielectric layers 412, 414, 416 may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 412, 414, 416 are formed by suitable fabrication techniques such as spin-on coating, chemical vapor deposition (CVD), plasma-enhanced chemical vapor deposition (PECVD) or the like.

In some embodiments, the material of the conductive layers 411, 413, 415, 417 may be made of metallic materials formed by electroplating or deposition, such as aluminum, titanium, copper, nickel, tungsten, and/or alloys thereof, which may be patterned using a photolithography and etching process. In some embodiments, the conductive layer 411, 413, 415 may be patterned copper layers or other suitable patterned metal layers. In some embodiments, the materials of the conductive pads 417P may include copper, nickel, titanium, tungsten, or alloys thereof or the like, and may be formed by an electroplating process, for example. In some embodiments, the conductive blocks 418 are formed by printing or electroplating solder paste blocks on the conductive pads 417P.

As illustrated in FIG. 1, after forming the conductive blocks 418 on the conductive pads 417P, the redistribution circuit structure 400 is obtained and a pre-cutting process is performed to the redistribution circuit structure 400 to form pre-cut lanes S1. In some embodiments, the pre-cutting process includes performing a blade cutting process or a laser cutting process to form the pre-cut lanes S1 cutting through the dielectric layers 416, 414, 412 and cutting into the encapsulant 300 with a depth smaller than the whole thickness of the encapsulant 300.

Figure 2:
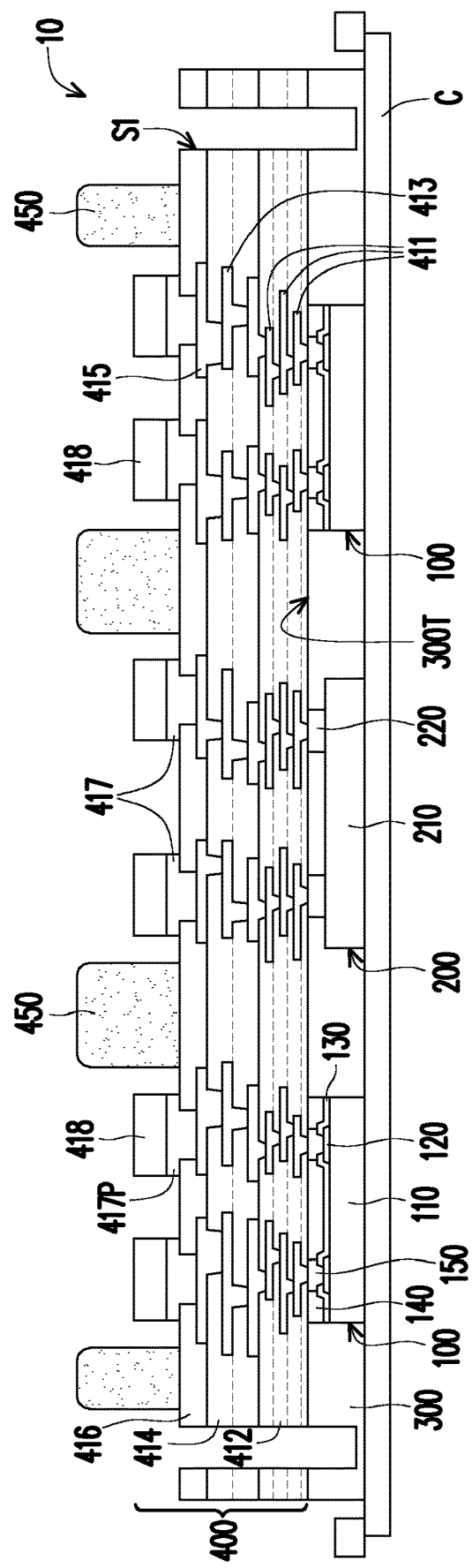

Referring to FIG. 2, in some embodiments, insulating affixing blocks 450 are formed on the topmost dielectric layer 416 of the redistribution circuit structure 400 and beside the conductive blocks 418. In some embodiments, the insulating affixing blocks 450 are spaced apart from one another and are located beside and between the conductive blocks 418. In some embodiments, the affixing blocks 450 are mainly arranged along or by the boundaries of the mounted modules and may be regarded as boundary affixing blocks, and certain affixing blocks 450 may be fully located underneath the mounted modules and may be regarded as inner affixing blocks. The arrangement of the insulating affixing blocks 450 will be described later in the following paragraphs. In some embodiments, the material of the insulating affixing blocks 450 includes an insulating polymer material and may also be referred to as polymer blocks. For example, the polymer material may include epoxy resins, acrylic resins, polyimide (PI), or combinations thereof. In some embodiments, the material of the insulating affixing blocks 450 is free of silica fillers or other fillers. The formation of the insulating affixing blocks 450 includes dispensing a polymer material in a discontinuous pattern (e.g. separate islands) on the dielectric layer 416 through a needle dispenser. In one embodiment, the needle dispenser has a diameter ranging from about 300 microns to about 600 microns. In some embodiments, the polymer material of the insulating affixing blocks 450 is adhesive with non-flowable or non-drip paste consistency. In some embodiments, the polymer material of the insulating affixing blocks 450 is viscous with a viscosity of about 60~90 pascal-second (Pa·s).

In some embodiments, the insulating affixing blocks 450 may be formed from the same polymer material. In some embodiments, the insulating affixing blocks 450 to be mounted with different types of modules may be formed with different polymer materials.

Figure 3:
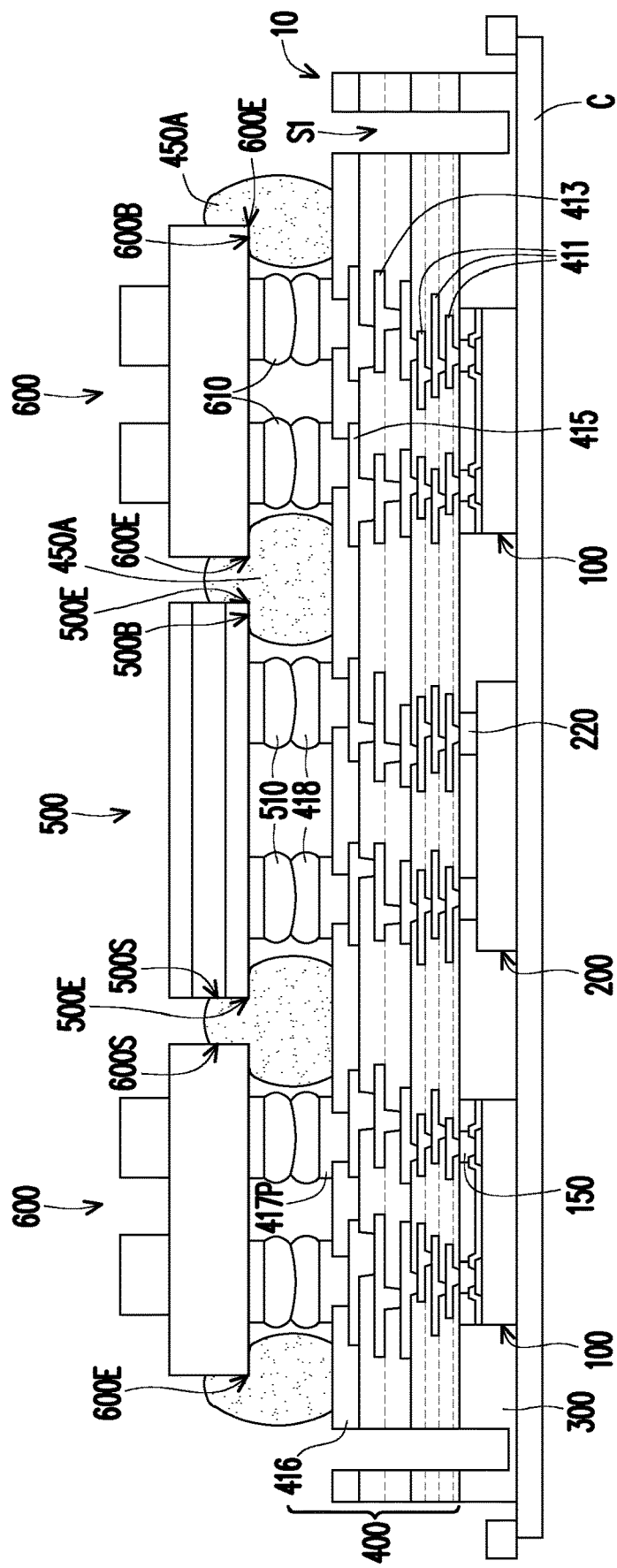

Referring to FIG. 3, in some embodiments, at least one electronic device module 500 having connectors 510 and connecting modules 600 having connectors 610 are provided and the electronic device module 500 and the connecting modules 600 are mounted onto the conductive blocks 418 on the conductive pads 417P. In some embodiments, the electronic device module 500 includes a voltage regulator module or at least one voltage regulator. In some embodiments, the connecting module(s) 600 includes a connector plug with one or more electrical connectors.

In some embodiments, after aligning and mounting the electronic device module 500 and the connecting modules 600 onto the conductive blocks 418, a first reflow process is performed to soften and partially melt the conductive blocks 418 so that the connectors 510, 610 are attached to the conductive blocks 418. In some embodiments, the first reflow process is a rapid thermal process performed for about 10-15 minutes at a temperature ranging from about 140 degrees Celsius to 160 degrees Celsius or about 150 degrees Celsius to 155 degrees Celsius. As the electronic device module 500 and the connecting modules 600 are mounted and attached to the conductive blocks 418, the electronic device module 500 and the connecting modules 600 onto the conductive blocks 418 are pressed and sunken into the insulating affixing blocks 450, and the insulating affixing blocks 450 are pressed and deformed to become the insulating affixing blocks 450A. As seen in FIG. 3, the lower edges 500E of the electronic device module 500 and the lower edges 600E of the connecting modules 600 are projected into the deformed insulating affixing blocks 450A. That is, the pressed insulating affixing blocks 450A physically contact the sidewalls 500S, the bottom surface 500B and the lower edges 500E of the electronic device module 500, and physically contact the sidewalls 600S, the bottom surfaces 600B and the lower edges 600E of the connecting modules 600.

Referring to FIG. 3, in some embodiments, a curing process is performed to cure the insulating affixing blocks 450A and the insulating affixing blocks 450A remain the pressed configurations. In some embodiments, the curing process includes performing a steady heating process in an oven under a temperature ranging from about 140 degrees Celsius to 160 degrees Celsius or about 150 degrees Celsius for 10 minutes to an hour. After the curing process, even though the insulating affixing blocks 450A are cured, the insulating affixing blocks 450A are pretty elastic having a modulus of elasticity (elastic modulus) of about 6-8 GPa. In some embodiments, the insulating affixing blocks 450A function as the stress buffer for relieving the thermal stress caused during the reflow process or the thermal process. In some embodiments, the insulating affixing blocks 450A has a coefficient of thermal expansion (CTE) smaller than the CTE of the above module 500, 600 and larger than the CTE of the below package 10.

In some embodiments, the insulating affixing blocks 450A formed below the electronic device module 500 and the insulating affixing blocks 450A formed below the connecting modules 600 are formed with different polymer materials. For example, the insulating affixing blocks 450A formed below the electronic device module 500 have the elastic modulus smaller than the elastic modulus of the insulating affixing blocks 450A formed below the connecting modules 600. In some embodiments, the insulating affixing blocks 450A formed below the electronic device module 500 may have the elastic modulus almost equivalent to the elastic modulus of the insulating affixing blocks 450A formed below the connecting modules 600.

Figure 4:
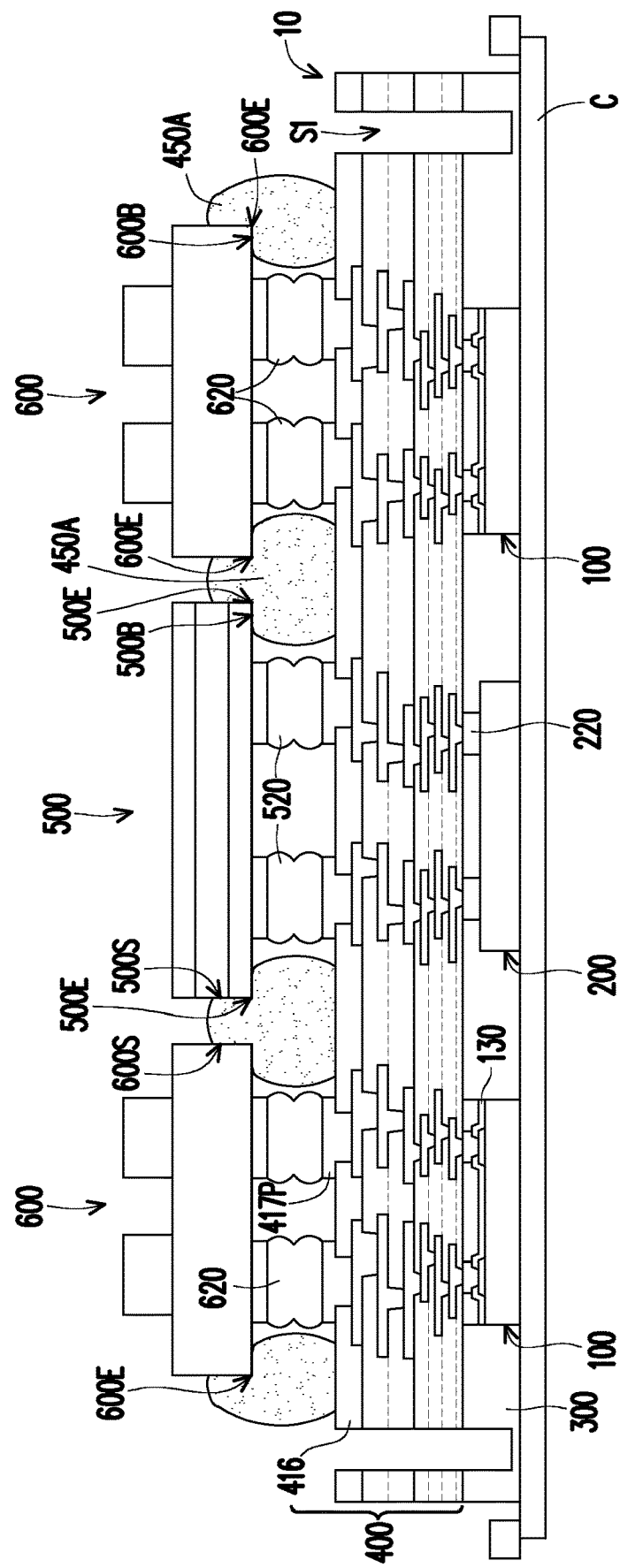

Referring to FIG. 4, a second reflow process is performed to melt and bond the connectors 510, 610 with the conductive blocks 418 together, so that the electronic device module 500 and the connecting modules 600 are bonded to the conductive pads of the redistribution circuit structure 400 with the molten connectors 520 and 620 there-between. In some embodiments, the second reflow process is a rapid thermal process performed for about 10-15 minutes at a temperature ranging from about 230 degrees Celsius to 250 degrees Celsius or about 235 degrees Celsius. In some embodiments, the connectors 520 and 620 include solder balls, ball grid array (BGA) connectors, metal pillars, controlled collapse chip connection (C4) bumps, micro bumps, bumps formed via electroless nickel-electroless palladium-immersion gold technique (ENEPIG), a combination thereof (e. g, a metal pillar with a solder ball attached), or the like.

Figure 5:
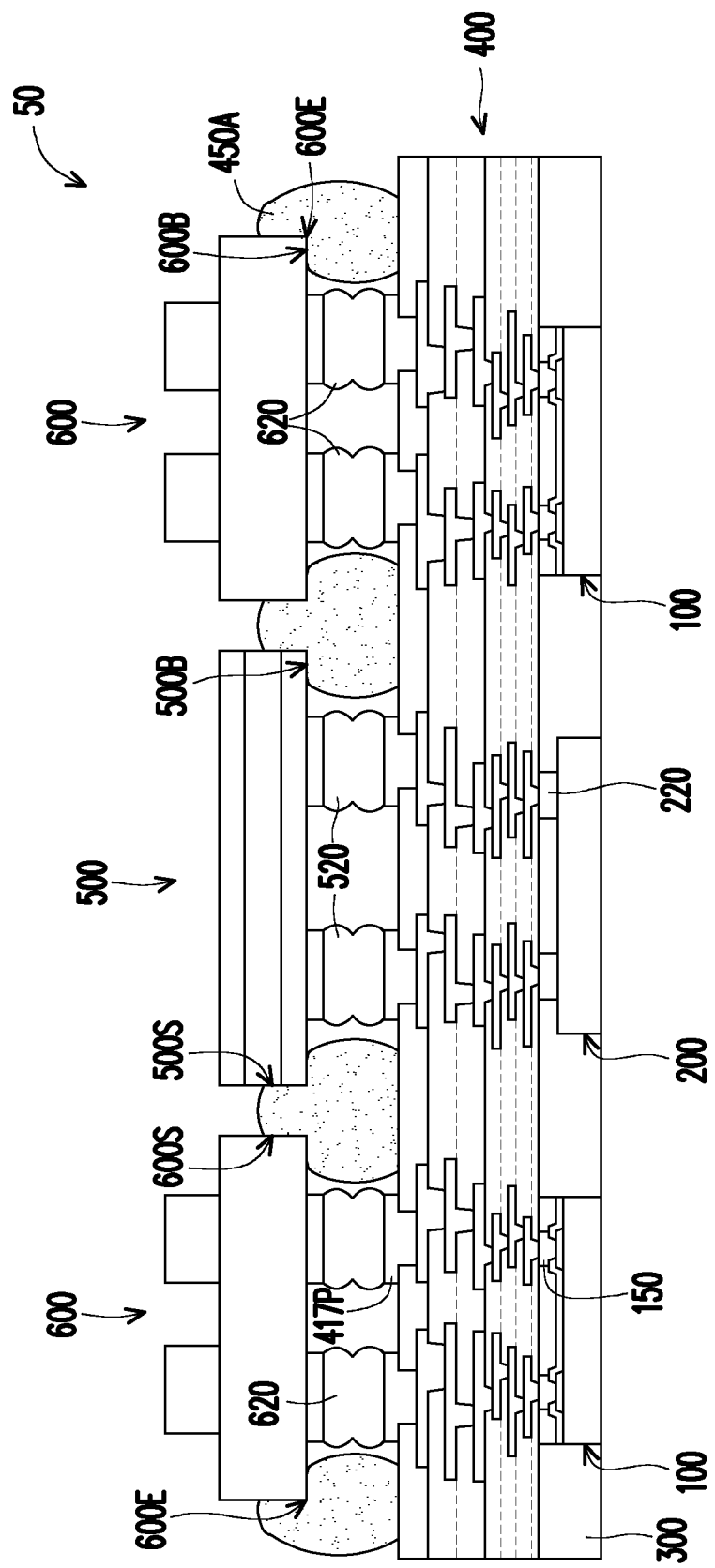

Referring to FIG. 4 and FIG. 5, a dicing process is performed to the structure illustrated in FIG. 4 along the pre-cut lanes S1, and the structure illustrated in FIG. 4 is diced or singulated along the pre-cut lanes (dicing lanes) S1 to form a plurality of package structures 50. Afterwards, the carrier C is removed. In some embodiments, the dicing process or the singulation process typically involves dicing with a mechanical cutting process using a rotating blade or a laser cutting process with laser beam.

In some embodiments, the package structure 50 may be further electrically connected to other apparatus or outer environment through the connecting modules 600.

As the insulating affixing blocks are formed before surface mounting the electronic device module(s) and/or the connecting module(s), the electronic device module(s) and/or the connecting module(s) are stably attached to the below package and less or no cracking and delamination occur during the thermal process(es) or reflow process(es). During the thermal process, the insulating affixing blocks have tensile strength strong enough to counterbalance the tensile force caused by the warpage and the CTE mismatch between the below package and mounted modules. Hence, the reliability of the package structure is significantly improved.

Figure 6B:
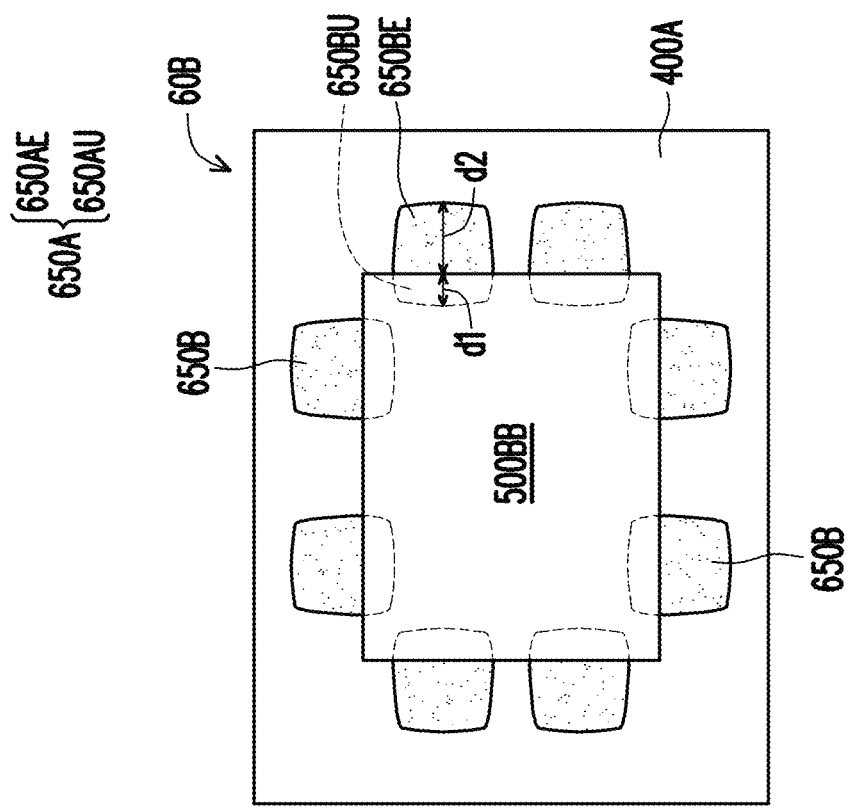
FIG. 6A, FIG. 6B, FIG. 6C and FIG. 6D are schematic top views of portions of examples of semiconductor packages in accordance with some embodiments of the present disclosure.
Figure 6A:
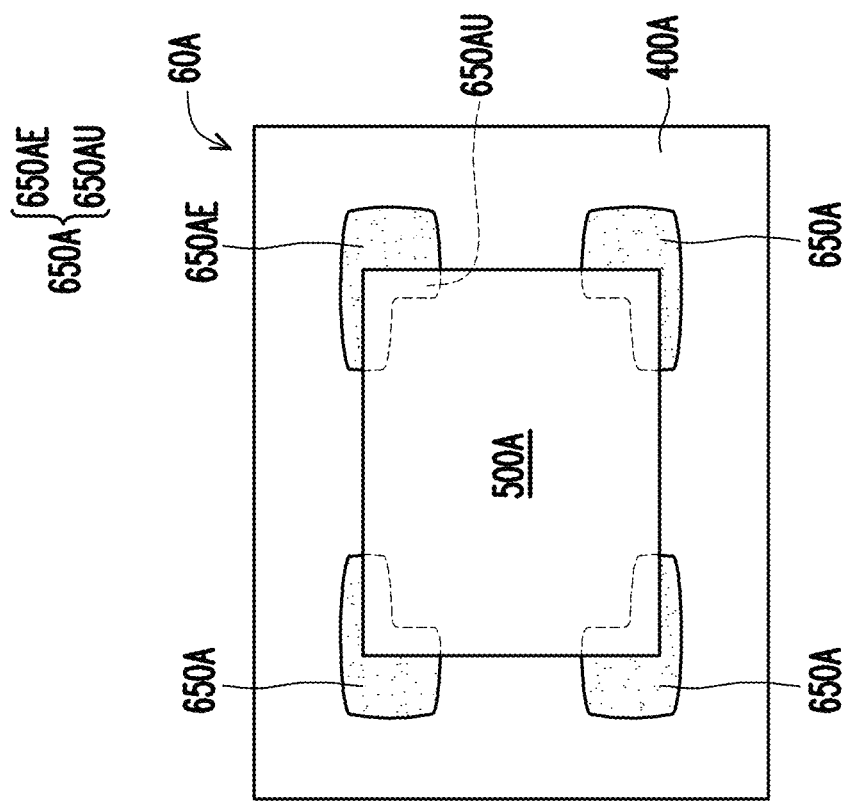

FIG. 6A and FIG. 6B are schematic top views of portions of examples of semiconductor packages in accordance with some embodiments of the present disclosure.

As seen in FIG. 6A, the package structure 60A is similar to the package structure 50 described in the previous embodiment(s), and similar elements or components may be labeled with the same or similar reference numbers. In some embodiments, the insulating affixing blocks 650A are located on the redistribution circuit structure 400A and between the mounting module 500A and the redistribution circuit structure 400A, and the insulating affixing blocks 650A are located at four corners of the rectangular module 500A. It is seen that the insulating affixing blocks 650A include four separate blocks respectively at four corners, and the four separate blocks are spaced apart from one another. Unlike the underfill filling the space between the mounting module 500A and the below redistribution circuit structure 400A, the insulating affixing blocks 650A are only located at four corners along the periphery of the mounting module 500A, while other space between the mounting module 500A and the below redistribution circuit structure 400A remain void. As seen in FIG. 6A, in some embodiments, after mounting the modules 500A, the insulating affixing block 650A extends below the module 500A (see the dotted line) with various extension distances in different directions, and the insulating affixing block 650A includes an exposed portion 650AE beside the sidewall(s) of the module 500A, and a footing portion 650AU right below the module 500A. In FIG. 6A, either the exposed portion 650AE or the footing portion 650AU has an L shape (rotated 90 degrees).

Similarly, as seen in FIG. 6B, the package structure 60B is similar to the package structure 50 described in the previous embodiment(s), and similar elements or components may be labeled with the same or similar reference numbers. In some embodiments, the insulating affixing blocks 650B are located on the redistribution circuit structure 400A and between the mounting module 500BB and the redistribution circuit structure 400A, and the insulating affixing blocks 650B are located along four sides of the rectangular module 500BB. It is seen that the insulating affixing blocks 650B include eight separate blocks respectively located at four sides, and the separate blocks that are spaced apart from one another are arranged near the corners but not at the corners. In some embodiments, two separate insulating affixing blocks 650B are arranged as a pair located respectively at two sides of the corner (the two extending sides of such corner). In some embodiments, as seen in FIG. 6B, the insulating affixing block 650B includes an exposed portion 650BE and a footing portion 650BU right below the module 500BB. In FIG. 6B, either the exposed portion 650BE or the footing portion 650BU has a rectangular shape, but the exposed portion 650BE has an extension distance d2 larger than an extension distance d1 of the footing portion 650BU.

Figure 8:
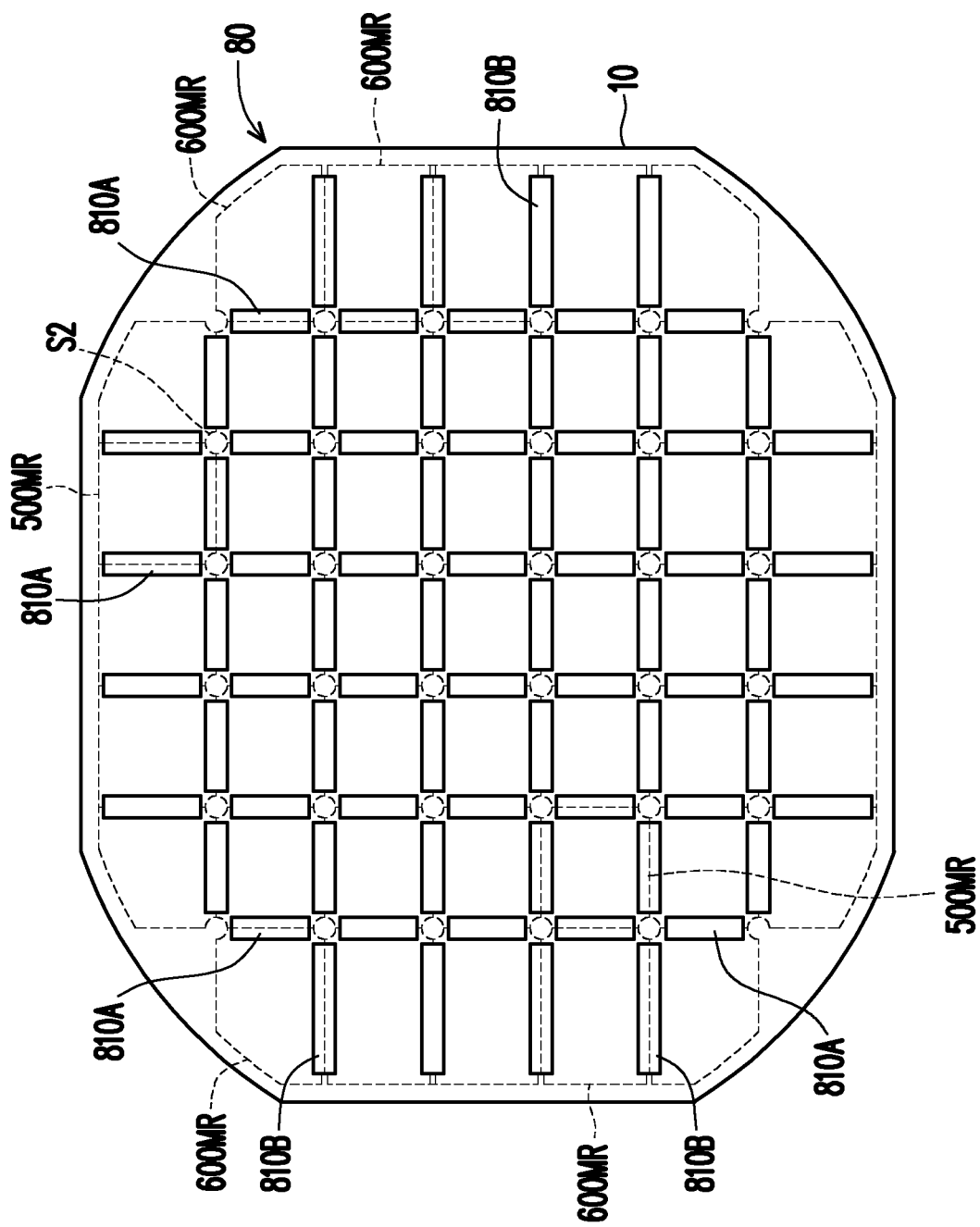
FIG. 8 is a schematic top view illustrating the arrangement of the insulating affixing blocks in an exemplary semiconductor package structure in accordance with some embodiments of the present disclosure.

FIG. 8 is a schematic top view illustrating the arrangement of the insulating affixing blocks before mounting the modules in an exemplary semiconductor package structure in accordance with some embodiments of the present disclosure. Referring to FIG. 8, for the package structure 80 that will have the modules mounted on the below package 10 (e.g. the InFO package), the insulating affixing blocks 810A and 810B are arranged around the mounting regions 500MR and 600MR of the modules to be mounted. For example, the mounting region 500MR and the next mounting region 600MR, or the neighboring mounting regions 500MR or the neighboring mounting regions 600MR may share one common joining side, and the insulating affixing blocks 810A or 810B may be distributed over or arranged on the common joining side. In some embodiments, the affixing blocks 810A or 810B located on the common side may be joined with two modules and connect the two modules to the underlying package 10 at the same time. In some embodiments, at least two or three or four separate insulating affixing blocks 810A are arranged at four sides around the mounting region 500MR of the to-be-mounted electronic device module(s) but avoid the corners of the mounting region 500MR, as screw holes S2 are located at the corners of the mounting region 500MR. In some embodiments, the insulating affixing blocks 810A and 810B of different lengths are respectively arranged at two sides or three sides of the mounting region(s) 600MR of the to-be-mounted connecting module(s), and the insulating affixing blocks 810A and 810B do not cover the locations of screw holes S2. In one embodiment, the insulating affixing block 810A has an extending length shorter than that of the insulating affixing block 810B.

Figure 7A:
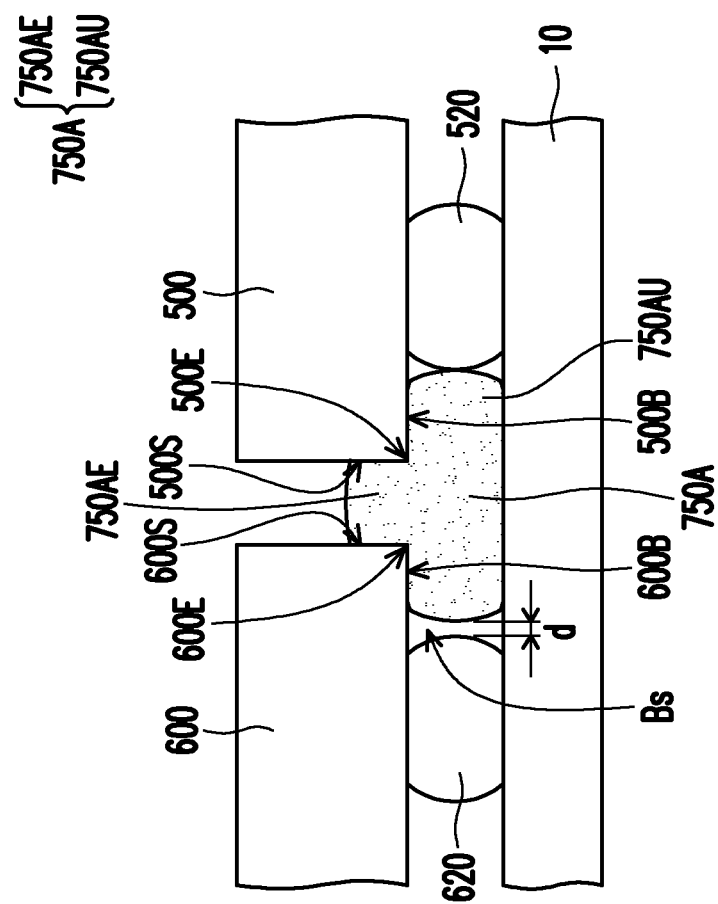
FIG. 7A, FIG. 7B and FIG. 7C are schematic cross-sectional views of portions of examples of semiconductor packages in accordance with some embodiments of the present disclosure.
Figure 7B:
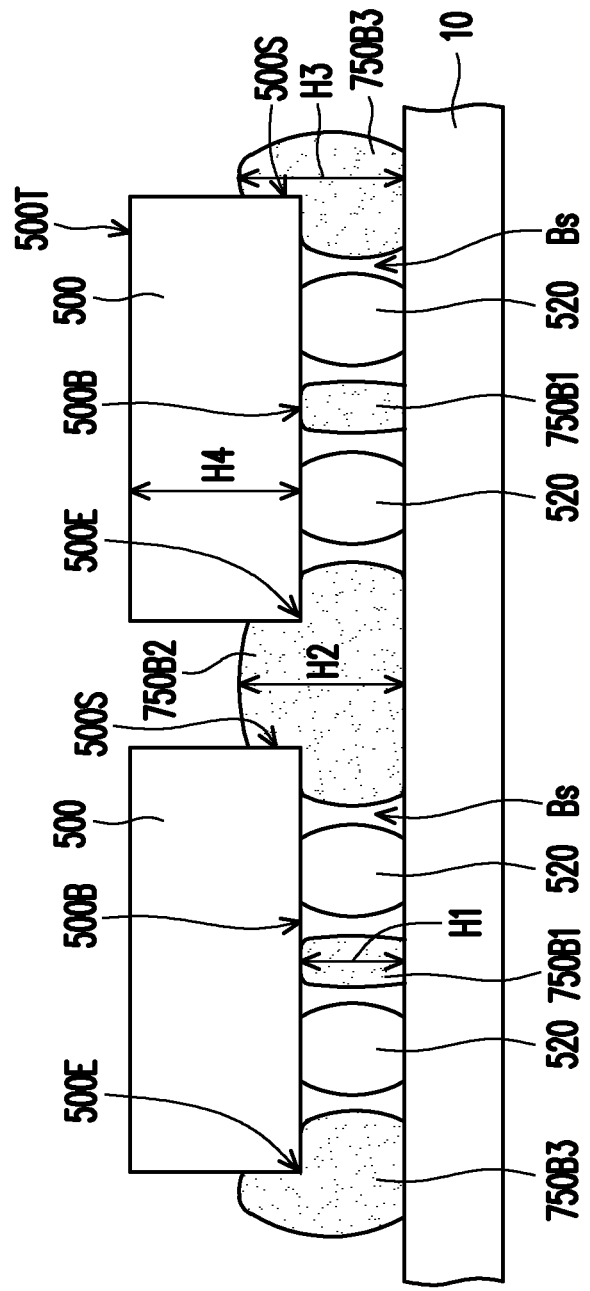
Figure 7C:
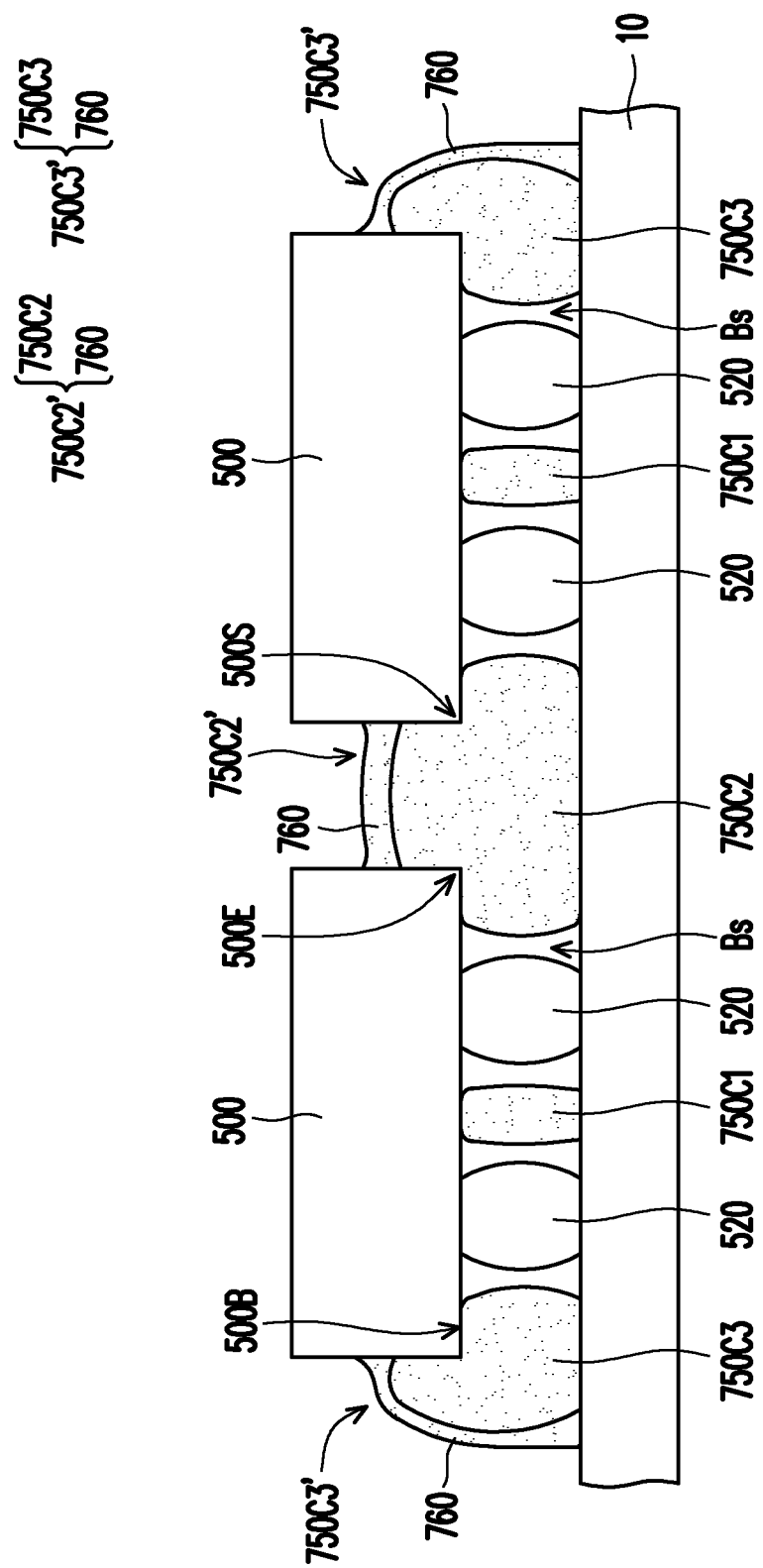

FIG. 7A, FIG. 7B and FIG. 7C are schematic cross-sectional views of portions of examples of semiconductor packages in accordance with some embodiments of the present disclosure.

As seen in FIG. 7A, in some embodiments, the modules 500 and 600 are bonded with the below package 10 through the connectors 520 and 620, and the insulating affixing block 750A is located between the modules 500, 600 and the package 10. As seen in FIG. 7A, the lower edges 500E of the electronic device module 500 and the lower edges 600E of the connecting modules 600 are projected into and wrapped by the insulating affixing block 750A. In some embodiments, the insulating affixing block 750A physically contacts the sidewall(s) 500S, the bottom surface 500B and the lower edge(s) 500E of the electronic device module 500, and physically contacts the sidewall(s) 600S, the bottom surfaces 600B and the lower edge(s) 600E of the connecting modules 600. As seen in FIG. 7A, in some embodiments, as the modules are mounted and pressed onto the insulating affixing block(s) 750A after the insulating affixing block(s) 750A is formed, the insulating affixing block(s) 750A may be squeezed and extended further into the space, and the insulating affixing block(s) 750A physically contacts some of the connector(s) 520. However, unlike the underfill, there is void space Bs existing between the connectors and insulating affixing blocks. In some embodiments, there is a short distance d between the sidewall of the connector 620 and the sidewall of the insulating affixing block(s) 750A. In one embodiment, the distance d is about or smaller than 100 microns.

In some embodiments, in FIG. 7A, the insulating affixing block 750A includes an exposed portion 750AE and footing portions 750AU respectively under the modules 500 and 600. As seen in FIG. 7A, the footing portion 750AU under the module 500 physically contacts the connector 520, while the footing portion 750AU under the module 600 does not contact the connector 620. It is understood that the arrangement of the insulating affixing block(s) may be changed or modified according to the layout design or the types of modules, and the footing portion(s) of the insulating affixing block(s) may physically contact the connector(s) of either or some of the mounted modules.

As seen in FIG. 7B, in some embodiments, the modules 500 are bonded with the below package 10 through the connectors 520, and the insulating affixing blocks 750B1, 750B2, 750B3 are located between the modules 500 and the package 10 and between the connectors 520. In some embodiments, the peripheral or outer insulating affixing blocks 750B3 and the mid insulating affixing block 750B2 in FIG. 7B, similar to the insulating affixing blocks 750A illustrated in FIG. 7A, physically contact the sidewalls 500S, the bottom surfaces 500B and the lower edges 500E of the electronic device modules 500. In some embodiments, as seen in FIG. 7B, the inner insulating affixing blocks 750B1 are located between the connectors 520 of the modules 500, and are located between the bottom surfaces 500B of the modules 500 and the below package 10, while there is void space Bs existing between the connectors 520 and insulating affixing blocks 750B1, 750B2 and 750B3. In some embodiments, the inner insulating affixing block(s) may further relieve the stress and counterbalance the warpage of the package structure.

Compared with the inner insulating affixing blocks 750B1 having a first height (or thickness) H1 in FIG. 7B, the mid insulating affixing block 750B2 has a second height (or thickness) H2 larger than the first height H1, and the outer insulating affixing blocks 750B3 have a third height (or thickness) H3 larger than the first height H1. In some embodiments, the volumes of different insulating affixing blocks are carefully tuned, so that the same type of insulating affixing blocks is formed uniformly with the same height suitable for the mounted module(s) to prevent cold joints. In some embodiments, as seen in FIG. 7B, the outer insulating affixing blocks 750B3 and the mid insulating affixing block 750B2 are formed with suitable heights, and the top surfaces of the same type of the modules 500 are substantially located at the same horizontal level so that there is a very small total thickness variation among the mounted modules 500 (the total thickness being measuring from the top surface of the redistribution circuit structure to the top surface of the module). For example, the inner insulating affixing blocks 750B1 are formed with about the same volume and the same height so that the bottom surfaces 500B of the modules 500 are substantially flush with each other and are located at the same horizontal level. In some embodiments, the second height H2 is slightly larger than or substantially equivalent to the third height H3. In some embodiments, either the second height H2 or the third height H3 is smaller than a third of the height (or thickness) H4 of the mounted module 500.

As seen in FIG. 7C, in some embodiments, the insulating affixing blocks 750C1, 750C2, 750C3, similar to the insulating affixing blocks 750B1, 750B2, 750B3 illustrated in FIG. 7B, are located between the modules 500 and the package 10 and between the connectors 520. In some embodiments, as seen in FIG. 7C, the peripheral or outer insulating affixing blocks 750C3 and the mid insulating affixing block 750C2 physically contact the sidewalls 500S, the bottom surfaces 500B and the lower edges 500E of the electronic device modules 500. In some embodiments, as seen in FIG. 7C, a polymer coating layer 760 is coated on the outer insulating affixing blocks 750C3 and the mid insulating affixing block 750C2. In some embodiments, after the formation of the insulating affixing blocks 750C1, 750C2 and 750C3, the modules 500 are mounted and bonded to the package 10. Following the formation of the insulating affixing blocks 750C1, 750C2 and 750C3, a dispensing process is performed to form a coating layer 760 onto the exposed portions of the insulating affixing blocks 750C2 and 750C3 without covering the footing portions of the insulating affixing blocks 750C2 and 750C3 and without covering the insulating affixing blocks 750C1. In some embodiments, another curing process may be performed to cure the coating layer 760 before the second reflow process. Even the footing portions of the insulating affixing blocks 750C2 and 750C3 and the insulating affixing blocks 750C1 located below the modules 500 are sheltered, the exposed portions of the insulating affixing blocks 750C2 and 750C3 are covered by the coating layers 760. In some embodiments, the insulating affixing blocks 750C2 and 750C3 and the coating layers 760 covered the exposed portions of the insulating affixing blocks 750C2 and 750C3 respectively constitute composite insulating affixing blocks 750C2' and 750C3'.

On the other hand, not covering by the coating layer(s) 760, the inner insulating affixing blocks 750C1 that are located between the connectors 520 of the modules 500, and are located between the bottom surfaces 500B of the modules 500 and the below package 10 remain the same volume(s) and same height(s), and the bottom surfaces 500B of the modules 500 are substantially flush with each other and are located at the same horizontal level. As seen in FIG. 7C, there is void space Bs existing between the connectors 520 and insulating affixing blocks 750C1, 750C2' and 750C3'.

In some embodiments, the material of the polymer coating layer 760 includes a polymer material, and the polymer material includes epoxy resins, acrylic resins, polyimide (PI), or combinations thereof. In some embodiments, the material of the coating layer 760 is free of silica fillers or other fillers. The formation of the coating layer 760 includes dispensing a polymer material directly on and over the insulating affixing blocks 750C2 and 750C1 through a needle dispenser. In some embodiments, the polymer material of the coating layer 760 is different from the polymer material of the insulating affixing blocks 750C1, 750C2 and 750C3. In some embodiments, the materials of the coating layer 760 and the insulating affixing blocks 750C1, 750C2 and 750C3 are different, the material of the coating layer 760 has a CTE and elastic modulus different from that of the insulating affixing block(s) 750C1, 750C2 or 750C3. In some embodiments, the polymer material of the coating layer 760 is the same as the polymer material of the insulating affixing blocks 750C1, 750C2 and 750C3.

Figure 6D:
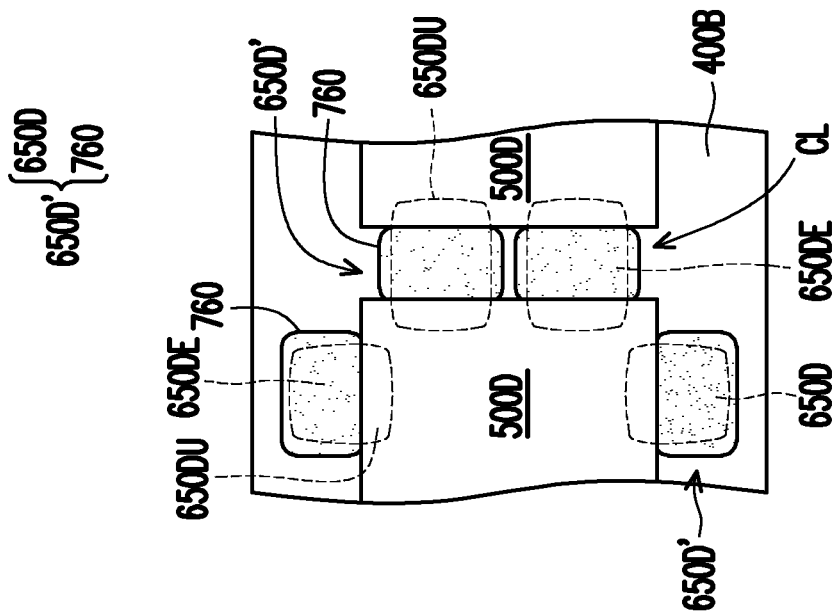
Figure 6C:
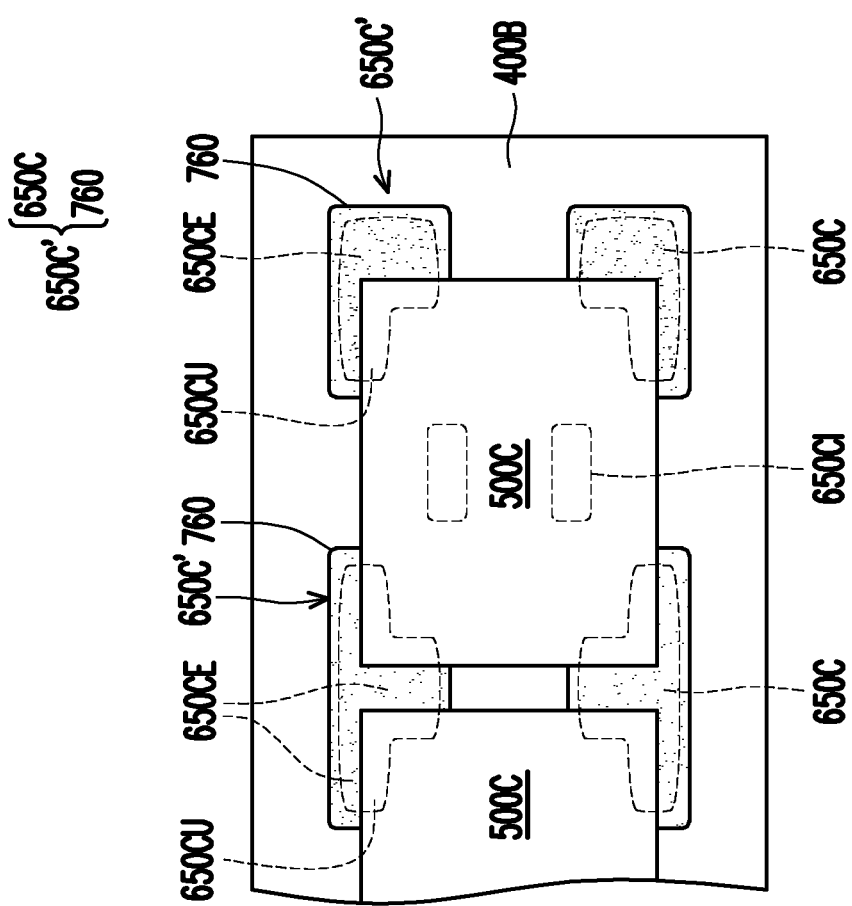

FIG. 6C and FIG. 6D are schematic top views of portions of examples of semiconductor packages in accordance with some embodiments of the present disclosure. As seen in FIG. 6C and FIG. 6D, the insulating affixing blocks 650C and 650D are located on the redistribution circuit structure 400B and between the mounting module 500C/500D and the redistribution circuit structure 400B. In FIG. 6D, the insulating affixing blocks 650D are located along four sides of the rectangular module 500D, and some affixing blocks 650D are located in the common lane or common zone CL between two adjacent modules 500D (defined by the opposing sides of the adjacent modules 500D). Referring to FIG. 6C and FIG. 6D, the coating layer(s) 760 is formed to cover the exposed portions 650CE and 650DE of the insulating affixing blocks 650C and 650D as well as portions of the top surface of the redistribution circuit structure 400B, without covering the mounted modules 500C/500D and the footing portions 650CU and 650DU. From the top views, the coating layer 760 has a span larger than the span of the exposed portions 650CE or 650DE. That is, the coating layers 760 may be formed along the edge(s) or sidewall(s) of the modules, covering the exposed portions of the insulating affixing blocks without covering the top surfaces of the mounted modules. In some embodiments, the composite insulating affixing blocks 650C' and 650D' are formed along the sidewalls of the modules and between the opposing sidewalls of the adjacent modules and extend below the mounted module(s) without covering the top surface(s) of the module(s). As seen in FIG. 6C, the insulating affixing blocks 650C are located at four corners of the rectangular module 500C and two inner insulating affixing blocks 650CI are located underneath the mounted module 500C, and the inner insulating affixing blocks 650CI are separate and spaced apart from each other and from the other insulating affixing blocks 650D located along the periphery of the module 500C.

Through the formation of the coating layer, composite insulating affixing blocks are formed to further strengthen the attachment of the mounted modules to the below package and counterbalance the warpage of the whole package structure.

Figure 9:
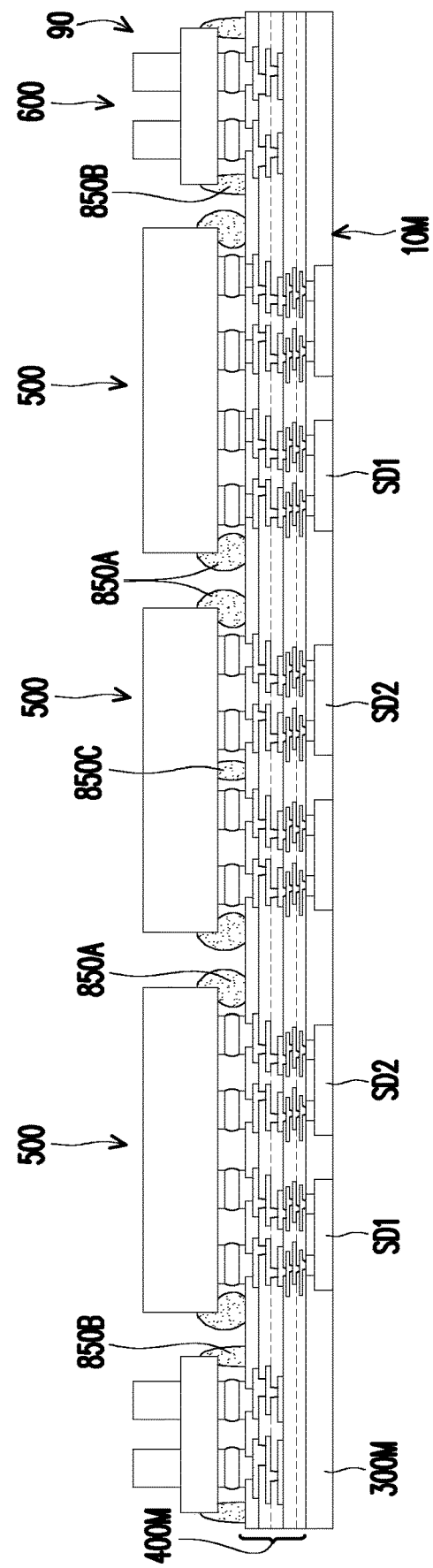
FIG. 9 and FIG. 10 are schematic views of exemplary semiconductor package structures in accordance with some embodiments of the present disclosure.
Figure 10:
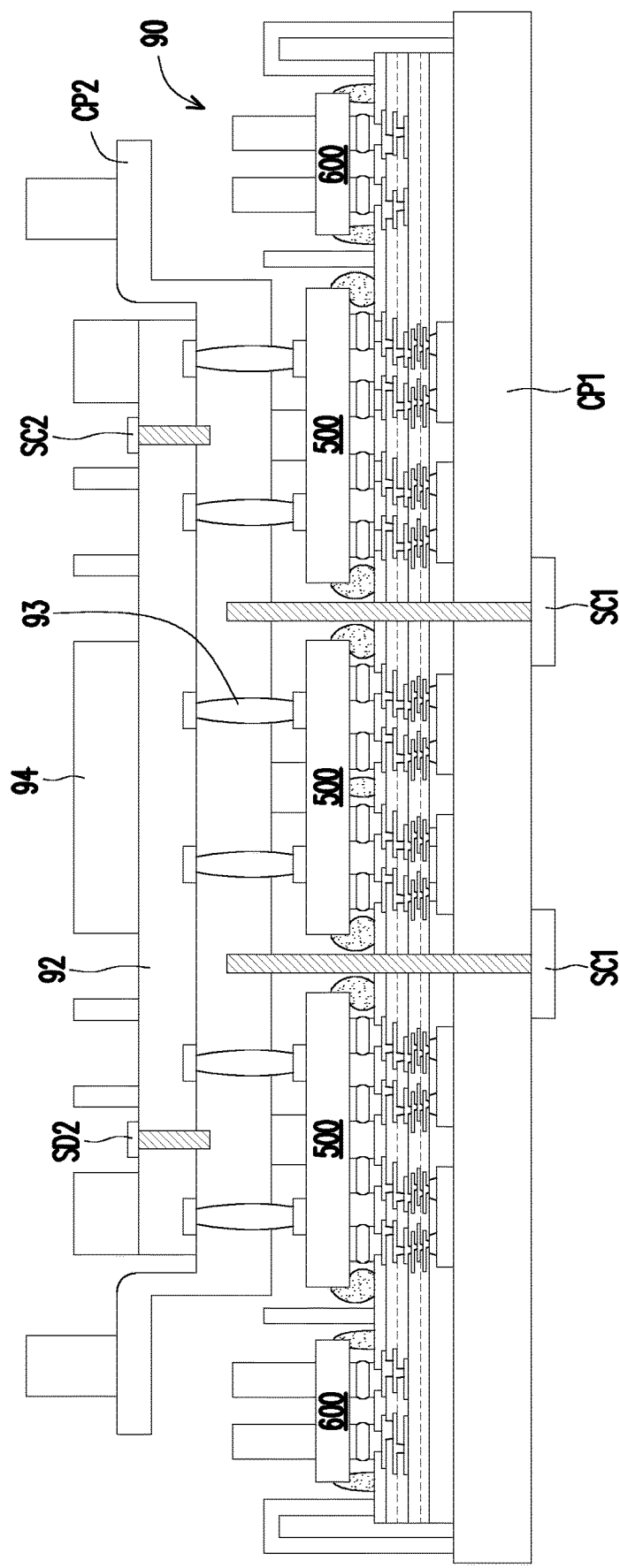

FIG. 9 and FIG. 10 are schematic views of exemplary semiconductor package structures in accordance with some embodiments of the present disclosure. In some embodiments, a package structure 90 is formed, and the package structure 90 may be fabricated using the process flow as previously described and similar to the package structure 50 illustrated in FIG. 5, and similar elements or components may be labeled with the same or similar reference numbers. Referring to FIG. 9, in some embodiments, the package 90 includes a redistribution circuit structure 400M disposed on the InFO package 10M, and the package 10M includes first semiconductor dies SD1 and second semiconductor dies SD2 laterally encapsulated by an encapsulant 300M. In some embodiments, the package structure 90 includes electronic device modules 500 and connecting modules 600 mounted on the redistribution circuit structure 400M. As seen in FIG. 9, the package structure 90 includes the insulating affixing blocks 850A and 850C located between the module(s) 500 and the redistribution circuit structure 400M, and the insulating affixing blocks 850B located between the module(s) 600 and the redistribution circuit structure 400M. In some embodiments, the insulating affixing blocks 850A and 850B may be or include composite insulating affixing blocks.

Referring to FIG. 10, in some embodiments, the package 90 may be further assembled with heat dissipating plates CP1 and CP2 through fastening elements SC1, and a control board 92 is fastened to the plate CP2 by another fastening elements SC2. In some embodiments, the control board 92 is electrically connected with the electronic device modules 500 through connecting elements 93, so that the electronic device modules 500 may be controlled or regulated by the control board 92. In some embodiments, a frame structure 94 may be joined with the control board 92.

In some embodiments, by using the insulating affixing blocks or the composite insulating affixing blocks, the warpage of the package structure can be minimized and less delamination or cracking occur in the redistribution circuit structure, so that the reliability and yield of the package structure are significantly enhanced.

In accordance with some embodiments of the present disclosure, a semiconductor package is provided. The semiconductor package includes a bottom package having first semiconductor dies encapsulated by an encapsulant, a redistribution circuit structure, a first module, a second module and insulating affixing blocks. The redistribution circuit structure is disposed on the bottom package. The first module is disposed on and electrically connected to the redistribution circuit structure by first connectors disposed between the redistribution circuit structure and the first module. The second module is disposed on and electrically connected to the redistribution circuit structure by second connectors disposed between the redistribution circuit structure and the second module. The first and second modules are adjacent to each other and disposed side by side on the redistribution circuit structure. The insulating affixing blocks are disposed on the redistribution circuit structure and between the first and second modules and the redistribution circuit structure. The insulating affixing blocks are separate blocks distributed along a common lane between the first and second modules. The insulating affixing blocks include first footing portions located below the first module, second footing portions located below the second module, and exposed portions exposed from the first and second modules. The insulating affixing blocks join the first and second modules to the redistribution circuit structure.

In accordance with some embodiments of the present disclosure, a semiconductor package is provided. The semiconductor package includes a package, a redistribution circuit structure, a first electronic device module, a second electronic device module and first, second and third insulating affixing blocks. The package has at least one semiconductor die. The redistribution circuit structure is disposed on the package. The first electronic device module is mounted on a first mounting region of the redistribution circuit structure and electrically connected with the at least one semiconductor die through first connectors disposed between the redistribution circuit structure and the first electronic device module. The second electronic device module is mounted on a second mounting region of the redistribution circuit structure and disposed beside the first electronic device module. The second electronic device module is electrically connected with the at least one semiconductor die through second connectors disposed between the redistribution circuit structure and the second electronic device module. The first mounting region and the second mounting region are adjacent and next to each other with a joining side. The first insulating affixing blocks are disposed on the redistribution circuit structure and between the first electronic device module and the redistribution circuit structure. The first insulating affixing blocks are separate blocks distributed along a periphery of the first mounting region. The first insulating affixing blocks join the first electronic device module to the redistribution circuit structure. The second insulating affixing blocks are disposed on the redistribution circuit structure and between the second electronic device module and the redistribution circuit structure. The second insulating affixing blocks are separate blocks distributed along a periphery of the second mounting region. The second insulating affixing blocks join the second electronic device module to the redistribution circuit structure. The third insulating affixing blocks are disposed on the redistribution circuit structure and between the first and second electronic device modules and the redistribution circuit structure. The third insulating affixing blocks are separate blocks distributed along the joining side, and the third insulating affixing blocks join the first and second electronic device modules to the redistribution circuit structure.

In accordance with some embodiments of the present disclosure, a method for forming a semiconductor package is provided. A bottom package including semiconductor dies encapsulated by an encapsulant is provided. A redistribution circuit structure is formed on the bottom package. The redistribution circuit structure is electrically connected to the semiconductor dies. Insulating blocks are formed on the redistribution circuit structure. A first module with first connectors and a second module with second connectors are provided. The first module and the second module are mounted onto the insulating blocks over the redistribution circuit structure. A curing process is performed to the insulating blocks to form insulating affixing blocks joining the first module and the second module to the redistribution circuit structure. The first module and the second module are bonded to the redistribution circuit structure by the first and second connectors.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor package, comprising:
a bottom package having first semiconductor dies encapsulated by an encapsulant;
a redistribution circuit structure disposed on the bottom package;
a first module, disposed on and electrically connected to the redistribution circuit structure by first connectors disposed between the redistribution circuit structure and the first module;
a second module, disposed on and electrically connected to the redistribution circuit structure by second connectors disposed between the redistribution circuit structure and the second module, wherein the first and second modules are adjacent to each other and disposed side by side on the redistribution circuit structure;
insulating affixing blocks, disposed on the redistribution circuit structure and between the first and second modules and the redistribution circuit structure, wherein the insulating affixing blocks are separate blocks distributed along a common lane between the first and second modules, the insulating affixing blocks include first footing portions located below the first module, second footing portions located below the second module, and exposed portions exposed from the first and second modules, and the insulating affixing blocks join the first and second modules to the redistribution circuit structure; and inner insulating affixing blocks disposed below the first module and between the first connectors, wherein the inner insulating affixing blocks are spaced apart from the first connectors and there is void space existing between the inner insulating affixing blocks and the first connectors.

2. The package according to claim 1, wherein at least one insulating affixing block physically contacts at least one first connector of the first connectors.

3. The package according to claim 1, wherein the first module includes a voltage regulator module.

4. The package according to claim 1, wherein the insulating affixing blocks include polymer coating layers covering the exposed portions.

5. The package according to claim 4, wherein the polymer coating layers have spans larger than spans of the exposed portions from a top view.

6. The package according to claim 1, wherein the insulating affixing blocks include polymer blocks.

7. The package according to claim 1, further comprising first outer insulating affixing blocks disposed below the first module and beside the first connectors, wherein the first outer insulating affixing blocks are partially exposed from the first module.

8. The package according to claim 7, further comprising second outer insulating affixing blocks disposed below the second module and beside the second connectors, wherein the second outer insulating affixing blocks are partially exposed from the second module.

9. A semiconductor package, comprising:
a package having at least one semiconductor die;
a redistribution circuit structure disposed on the package;
a first electronic device module, mounted on a first mounting region of the redistribution circuit structure and electrically connected with the at least one semiconductor die through first connectors disposed between the redistribution circuit structure and the first electronic device module;
a second electronic device module, mounted on a second mounting region of the redistribution circuit structure and disposed beside the first electronic device module, wherein the second electronic device module is electrically connected with the at least one semiconductor die through second connectors disposed between the redistribution circuit structure and the second electronic device module, the first mounting region and the second mounting region are adjacent and next to each other with a joining side;
first insulating affixing blocks, disposed on the redistribution circuit structure and between the first electronic device module and the redistribution circuit structure, wherein the first insulating affixing blocks are separate blocks distributed along a periphery of the first mounting region, and the first insulating affixing blocks join the first electronic device module to the redistribution circuit structure;
second insulating affixing blocks, disposed on the redistribution circuit structure and between the second electronic device module and the redistribution circuit structure, wherein the second insulating affixing blocks are separate blocks distributed along a periphery of the second mounting region, and the second insulating affixing blocks join the second electronic device module to the redistribution circuit structure;
third insulating affixing blocks, disposed on the redistribution circuit structure and between the first and second electronic device modules and the redistribution circuit structure, wherein the third insulating affixing blocks are separate blocks distributed along the joining side, and the third insulating affixing blocks join the first and second electronic device modules to the redistribution circuit structure; and
a fourth insulating affixing block disposed below the first electronic device module and between the first connectors, wherein the fourth insulating affixing block is spaced apart from the first connectors with a distance, and there is void space existing between the fourth insulating affixing block and the first connectors.

10. The package according to claim 9, wherein at least one third insulating affixing block physically contacts at least one first connector of the first connectors.

11. The package according to claim 9, wherein the first insulating affixing blocks include footing portions located underneath the first electronic device module and exposed portions exposed from the first electronic device module.

12. The package according to claim 11, wherein the first insulating affixing blocks include polymer coating layers covering the exposed portions.

13. The package according to claim 12, wherein a material of the polymer coating layers is different from a material of the exposed portions.

14. The package according to claim 9, wherein the third insulating affixing blocks include footing portions located underneath the first electronic device module or the second electronic device module and exposed portions exposed from the first and second electronic device modules.

15. The package according to claim 14, wherein the third insulating affixing blocks include polymer coating layers covering the exposed portions.

16. The package according to claim 12, wherein the polymer coating layers have spans larger than spans of the exposed portions from a top view.

17. The package according to claim 15, wherein the polymer coating layers have spans larger than spans of the exposed portions from a top view.

18. A method of manufacturing a semiconductor package, comprising:
providing a bottom package including semiconductor dies encapsulated by an encapsulant;
forming a redistribution circuit structure on the bottom package, wherein the redistribution circuit structure is electrically connected to the semiconductor dies;
forming insulating blocks on the redistribution circuit structure;
providing a first module with first connectors and a second module with second connectors;
mounting the first module and the second module onto the insulating blocks over the redistribution circuit structure;
performing a curing process to the insulating blocks to form insulating affixing blocks joining the first module and the second module to the redistribution circuit structure; and
bonding the first module and the second module to the redistribution circuit structure by the first and second connectors, wherein bonding the first module and the second module to the redistribution circuit structure by the first and second connectors includes performing a first reflow process at a first temperature before performing the curing process and performing a second reflow process at a second temperature after performing the curing process, and the first temperature is lower than the second temperature.

19. The method according to claim 18, wherein forming insulating blocks on the redistribution circuit structure includes dispensing a polymer material in a discontinuous pattern on the redistribution circuit structure.

20. The method according to claim 18, further comprising forming polymer coating layers over the insulating blocks after bonding the first module and the second module to the redistribution circuit structure.

* * * * *